United States Patent
Byeon

(10) Patent No.: US 7,697,347 B2
(45) Date of Patent: Apr. 13, 2010

(54) NON-VOLATILE MEMORY DEVICE AND METHOD OF DRIVING THE SAME

(75) Inventor: Dae-seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 265 days.

(21) Appl. No.: 11/972,819

(22) Filed: Jan. 11, 2008

(65) Prior Publication Data

US 2008/0209150 A1 Aug. 28, 2008

(30) Foreign Application Priority Data

Feb. 27, 2007 (KR) .................... 10-2007-0019924

(51) Int. Cl.
*G11C 7/10* (2006.01)
(52) U.S. Cl. ............ 365/189.05; 365/201; 365/189.011
(58) Field of Classification Search ............ 365/189.05, 365/201, 189.011
See application file for complete search history.

(56) References Cited

U.S. PATENT DOCUMENTS 5,067,111 A * 11/1991 Asano et al. ........... 365/189.08

FOREIGN PATENT DOCUMENTS

| JP | 2001-176290 | 6/2001 |
| JP | 2002-117692 | 4/2002 |
| JP | 2006-004478 | 1/2006 |

* cited by examiner

*Primary Examiner*—Son Dinh
*Assistant Examiner*—Nam Nguyen
(74) *Attorney, Agent, or Firm*—Volentine & Whitt, P.L.L.C.

(57) ABSTRACT

A method of driving a non-volatile memory device includes supplying power to the memory device, in which setting information related to setting an operating environment is copied and stored in multiple of regions of a memory cell array. An initial read operation of the memory cell array is performed and initial setting data is determined based on the initial read operation. The operating environment of the memory device is set based on the initial setting data. Corresponding portions of the stored copies of the setting information are read at the same time.

20 Claims, 10 Drawing Sheets

FAIL COLUMN

| Data1 (A) | Data2 (B) | Data3 (C) | Set_Data (D) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

NON-VOLATILE MEMORY DEVICE AND METHOD OF DRIVING THE SAME

CROSS-REFERENCE TO RELATED PATENT APPLICATIONS

A claim of priority is made to Korean Patent Application No. 10-2007-0019924, filed on Feb. 27, 2007, the subject matter of which is hereby incorporated by reference.

BACKGROUND OF THE INVENTION

1. Field of the Invention

The present invention relates to a non-volatile memory device and a method of driving the same, and more particularly, to a non-volatile memory device in which initial setting data is read from a memory cell array, and a method of driving the same.

2. Description of the Related Art

A flash memory, which is a popular type of non-volatile memory, is a memory device from which data can be electrically deleted and to which data can be electrically written. Flash memory not only consumes less power than storage media based on a magnetic disc memory, but also requires a relatively short access time, similar to hard discs.

Flash memory is categorized into a NOR type flash memory and a NAND type flash memory, depending on how cells and bit lines are connected. The NOR type flash memory has a structure in which two or more cell transistors are connected in parallel to each bit line, and stores data using a channel hot electron method and deletes data using a Fowler-Nordheim (F-N) tunneling method. The NAND type flash memory has a structure in which two or more cell transistors are connected in series to each bit line, and stores data or deletes data using the F-N tunneling method. In general, the NOR type flash memory consumes a large amount of current and is difficult to highly integrate, but operates at very high speeds. In contrast, the NAND type flash memory uses less cell current than the NOR type flash memory, and is easier to highly integrate.

FIG. 1A is a circuit diagram of a memory cell structure included in a conventional NAND type flash memory. FIG. 1A illustrates word lines WL11 through WL14 and memory cells M11 through M14. The memory cells M11 through M14 form a string structure together with selection transistors ST1 and ST2, and are connected in series between a bit line BL and a ground voltage source VSS. Since the NAND type flash memory uses a small amount of cell current, all memory cells connected to one word line are programmed during a single programming operation.

FIG. 1B is a circuit diagram of a memory cell structure included in a conventional NOR type flash memory. Referring to FIG. 1B, memory cells M21 through M26 are connected between a bit line BL1 (or BL2) and each source line CSL. Since the NOR type flash memory consumes a large amount of current in order to perform a programming operation, a limited number of memory cells are programmed during a single programming operation.

In general, a memory cell array included in a memory device may include a main cell that stores data, and a redundant cell that replaces the main cell when a defect occurs in the main cell. The memory device may further include a fuse circuit for storing the address of a defective cell. The fuse circuit senses when an address received from the outside is a defective address, and replaces the address of a defective cell with the address of a redundant cell.

The fuse circuit stores not only address information for repairing a defective cell, but also information for setting other operating environments when the memory device is powered on. For example, initial setting data, used to set the operating environment of the memory device, may control a DC voltage related to programming a memory device, or reading or erasing data from a memory device.

When the fuse circuit is set to store initial setting data, it is difficult to reprogram the fuse circuit once it is programmed according to a specific manner. It is possible to improve the flexibility of the operating environment of the memory device by reprogramming the initial setting data stored in the memory cell array, which may be done according to a method of storing initial setting data in a memory cell array.

FIG. 2 is a block diagram of a memory cell array 10 with bit lines, and a page buffer unit 20. Referring to FIG. 2, the memory cell array 10 includes one or more blocks $Block_0$ through $Block_n$, and may have a structure in which multiple pairs of even and odd bit lines BLe and BLo are arranged. The page buffer unit 20 includes multiple page buffers, which are electrically connected to respective pairs of the bit lines BLe and BLo. A page, which is a unit in which programming or data reading is performed in a flash memory, is generally 512 bytes long or 2 k bytes long. When the size of each page is 2 k bytes, for example, page buffers of 2 k bytes are arranged for the page.

FIG. 3 is a block diagram of a memory cell array with a redundant cell array 40, and first and second page buffer units 50 and 60. The memory cell array may include a main cell array 30 and the corresponding redundant cell array 40. For example, the redundant cell array 40 is used to replace "fail" columns of the main cell array 30.

The first page buffer unit 50 corresponding to the main cell array 30 includes multiple page buffers. The page buffers of the first page buffer unit 50 are electrically connected to respective bit lines of the main cell array 30. Also, the second buffer unit 60 corresponding to the redundant cell array 40 includes multiple page buffers. The page buffers of the second page buffer unit 60 are electrically connected to respective bit lines of the redundant cell array 40.

Referring to FIG. 3, the bit lines are arranged in the memory cell array, and a "fail" column may occur in some of them, for example, due to a cut in the bit lines or short circuiting between the bit lines during a manufacturing process. The "fail" column is replaced with a redundant column through a repairing process. According to the repairing process, when a memory device (not shown) is powered on, defective addresses (corresponding to "fail" columns) are read from the main cell array 30 and stored in a predetermined region. Thereafter, when part of the columns input by a user during a programming operation, a read operation, or an erasing operation includes a defective address, the defective column is replaced with a redundant column. FIG. 3 illustrates a repairing process in which "fail" columns occurring in the main cell array 30 are replaced with redundant columns in units of two page buffers. For example, two page buffers 51 corresponding to the columns having defective bit lines are replaced with two page buffers 61 corresponding to two redundant columns.

As described above, when a conventional non-volatile memory device is powered on, an initial read operation is performed to read initial setting data from a memory cell array, and an operating environment of the memory device is set based on the initial setting data. However, as described above, the initial setting data is read before a repairing operation is performed. That is, the initial setting data is read from the memory cell array, which may include "fail" columns.

Accordingly, the read initial setting data may include errors, in which case it is likely that the memory device cannot be set to a predetermined operating mode. Therefore, there is a need for preventing initial setting data, which is read from the memory device during an initial read operation, from being invalid.

SUMMARY OF THE INVENTION

According to an aspect of the present invention, there is provided a method of driving a non-volatile memory device. The method includes supplying power to the memory device, in which setting information related to setting an operating environment is copied and stored in multiple regions of a memory cell array; performing an initial read operation of the memory cell array; and determining initial setting data based on the initial read operation. The operating environment of the memory device is set based on the initial setting data.

The memory cell array may include multiple pages, which include the multiple regions in which the setting information is copied and stored. Also, corresponding portions of the stored copies of the setting information may be read at the same time.

Determining the initial setting data may include comparing corresponding portions of the stored copies of the setting information, and determining the initial setting data by combining the compared portions of the setting information to exclude a fail column.

Determining the initial setting data may also include comparing first setting information through $n^{th}$ setting information with one another, where the first setting information through the $n^{th}$ setting information are respectively stored in n regions, and n is an integer equal to or greater than 2. A data value occurring most frequently from among n data is determined to be valid based on the comparison. The n data includes respective data of the n setting information. Determining the initial setting data may include combining data values determined to be valid based on a result of the decision.

Each of the first through $n^{th}$ setting information may be A bytes long, where A is an integer equal to or greater than 1, and data bits of each of the first through $n^{th}$ setting information may be compared with one another to determine a most frequently occurring bit value. A combination of the data bits determined to have valid bit values may be determined as the initial setting data that is A bytes long.

Determining the initial setting data may include reading and comparing first through $n^{th}$ copies of a portion of the setting information that are respectively stored in n regions, where n is an integer equal to or greater than 2. If the result of the comparison reveals that a total number of the copies of the portion of the setting information having the same data value is equal to or greater than m, where m is a predetermined integer less than or equal to n, it may be determined that the data value is valid for the corresponding portion of the setting information. A combination of data values, from additional portions of the setting information determined to be valid, may be determined to be the initial setting data. Each of the n copies of the setting information may be A bytes long, where A is an integer equal to or greater than 1. The reading and comparing of the first through $n^{th}$ copies of the portion of the setting information may include comparing the values of bits of each of the first through $n^{th}$ copies of the setting information with one another.

According to another aspect of the present invention, there is provided a non-volatile memory device, including a memory cell array, an input/output buffer and a data determination unit. The memory cell array includes multiple regions, where setting information related to setting an operating environment are copied and stored in the regions. The input/output buffer temporarily stores or outputs data received from the memory cell array. The data determination unit receives copies of the setting information stored in the regions during an initial read operation performed when the memory device is powered on, compares the copies of setting information with one another, and outputs initial setting data based on the comparison.

The memory cell may include multiple pages, which include the multiple regions. During the initial read operation of the memory device, corresponding portions of the copies of the setting information may be read at the same time. The data determination unit may determine the initial setting data by combining data stored in normal columns, excluding fail columns, based on the result of reading and comparing the copies of setting information.

The data determination unit may receive and compare first through $n^{th}$ copies of each portion of the setting information stored in n regions of the memory cell array, and determine a data value corresponding to each portion of the setting information occurring most frequently among the first through $n^{th}$ copies, based on the comparison, where n is an integer equal to or greater than 2. The determination unit may determine the initial setting data by combining the determined data values.

Also, each of the n copies of the setting information may be A bytes long, where A is an integer equal to or greater than 1. The data determination unit may include multiple logic operation units, each receiving corresponding data bits of each of the first through $n^{th}$ copies of the A bytes of the setting information, where each of the logic operation units compares the received corresponding n data bits and determines a valid bit value based on the most frequently occurring value of the corresponding n data bits. The data determination unit may determine the initial setting data, which is A bytes long, by combining valid bit values and outputting the initial setting data.

The data determination unit may compare first through $n^{th}$ copies of each portion of the setting information, which are respectively copied and stored in n regions of the memory cell array, with one another. When the comparison reveals that a total number of data having the same value for each portion of the setting information is equal to or greater than m, the data determination unit may determine that the value is the valid data value for the corresponding portion of the setting information, where n is an integer equal to or greater than 2 and m is a predetermined integer less than or equal to n. The data determination unit may determine the initial setting data by combining multiple valid data values of corresponding portions of the setting information based on comparison results.

Each of the first through $n^{th}$ copies of each portion of the setting information may be A bytes long, where A is an integer equal to or greater than 1. The data determination unit may compare bits of each of the first through $n^{th}$ copies of each portion of the setting information with one another.

BRIEF DESCRIPTION OF THE DRAWINGS

The embodiments of the present invention will be described with reference to the attached drawings, in which.

DETAILED DESCRIPTION OF THE EMBODIMENTS

Figure 1A:
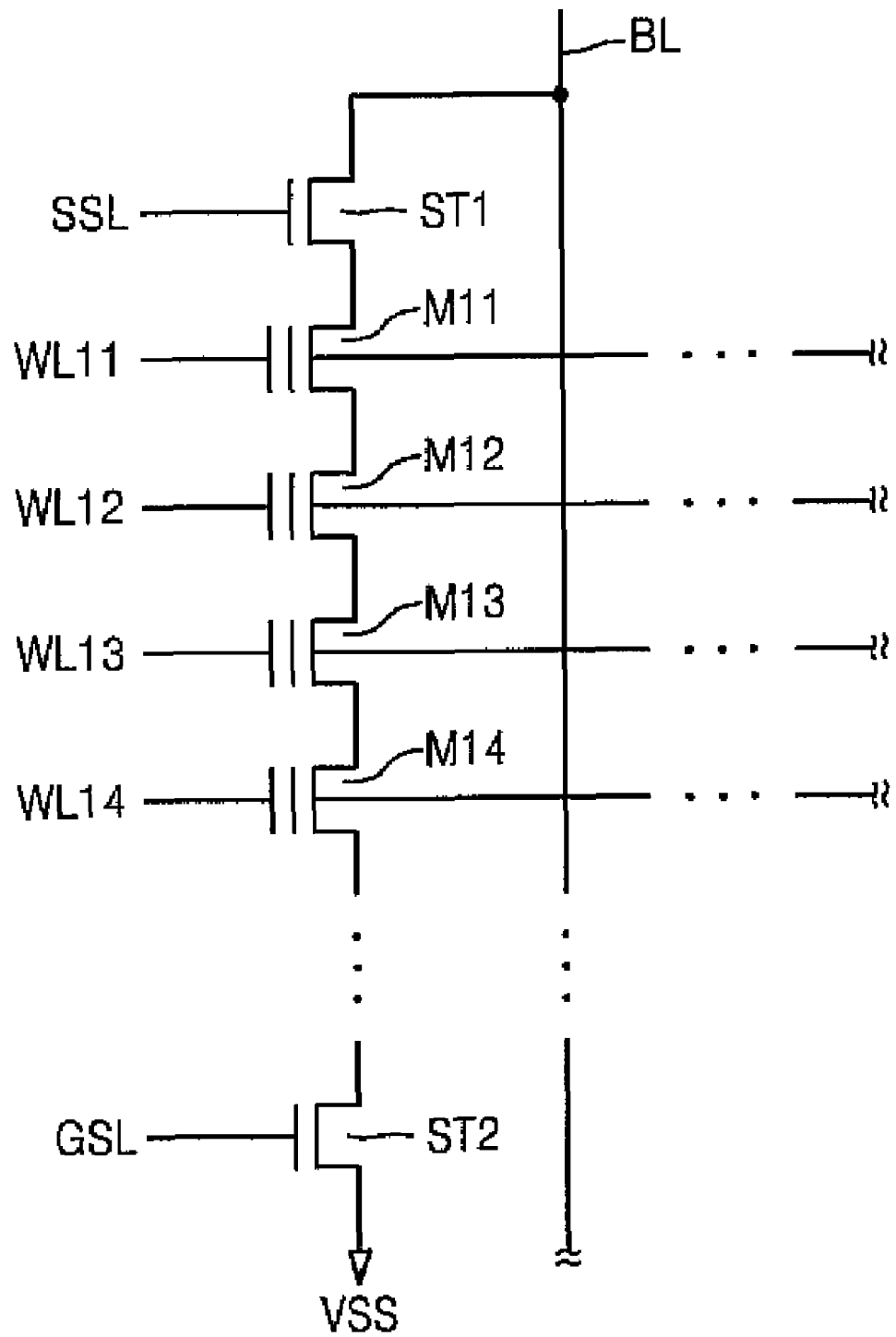
FIG. 1A is a circuit diagram of a memory cell structure included in a conventional NAND type flash memory.
Figure 1B:
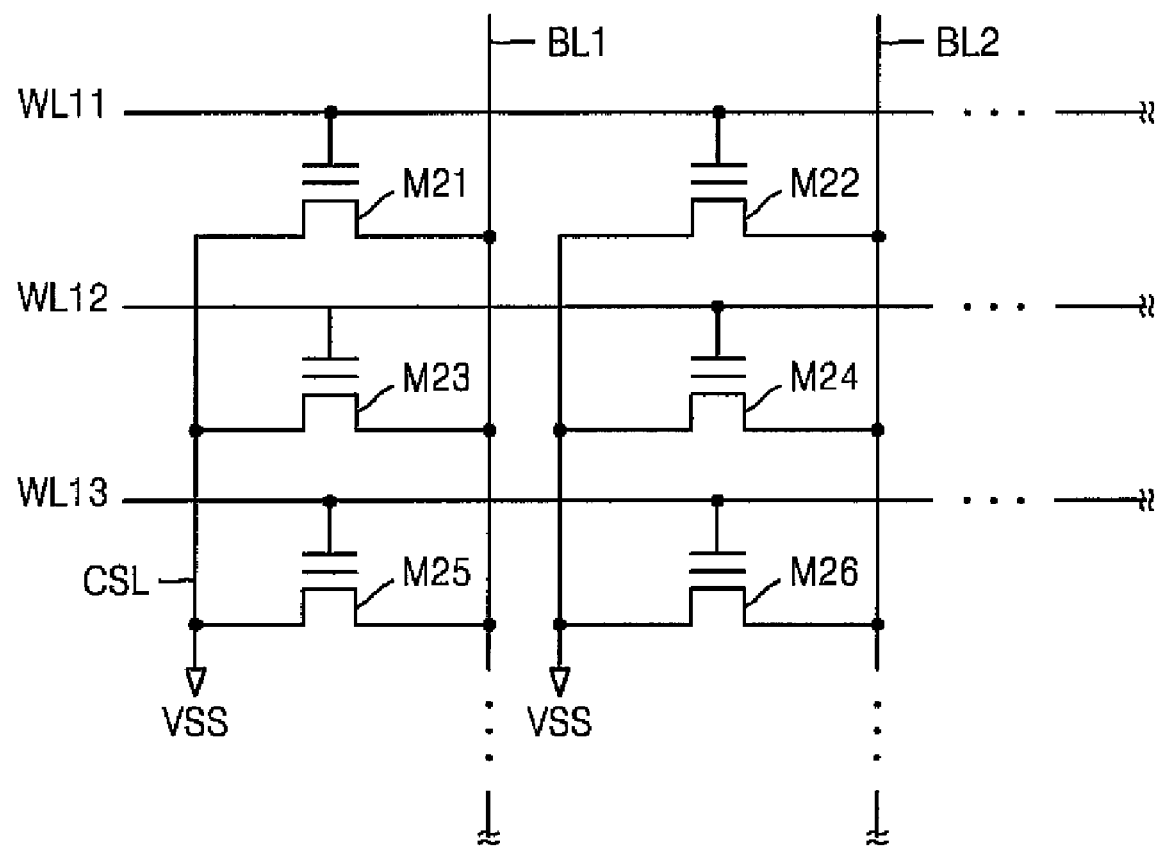
FIG. 1B is a circuit diagram of a memory cell structure included in a conventional NOR type flash memory.
Figure 2:
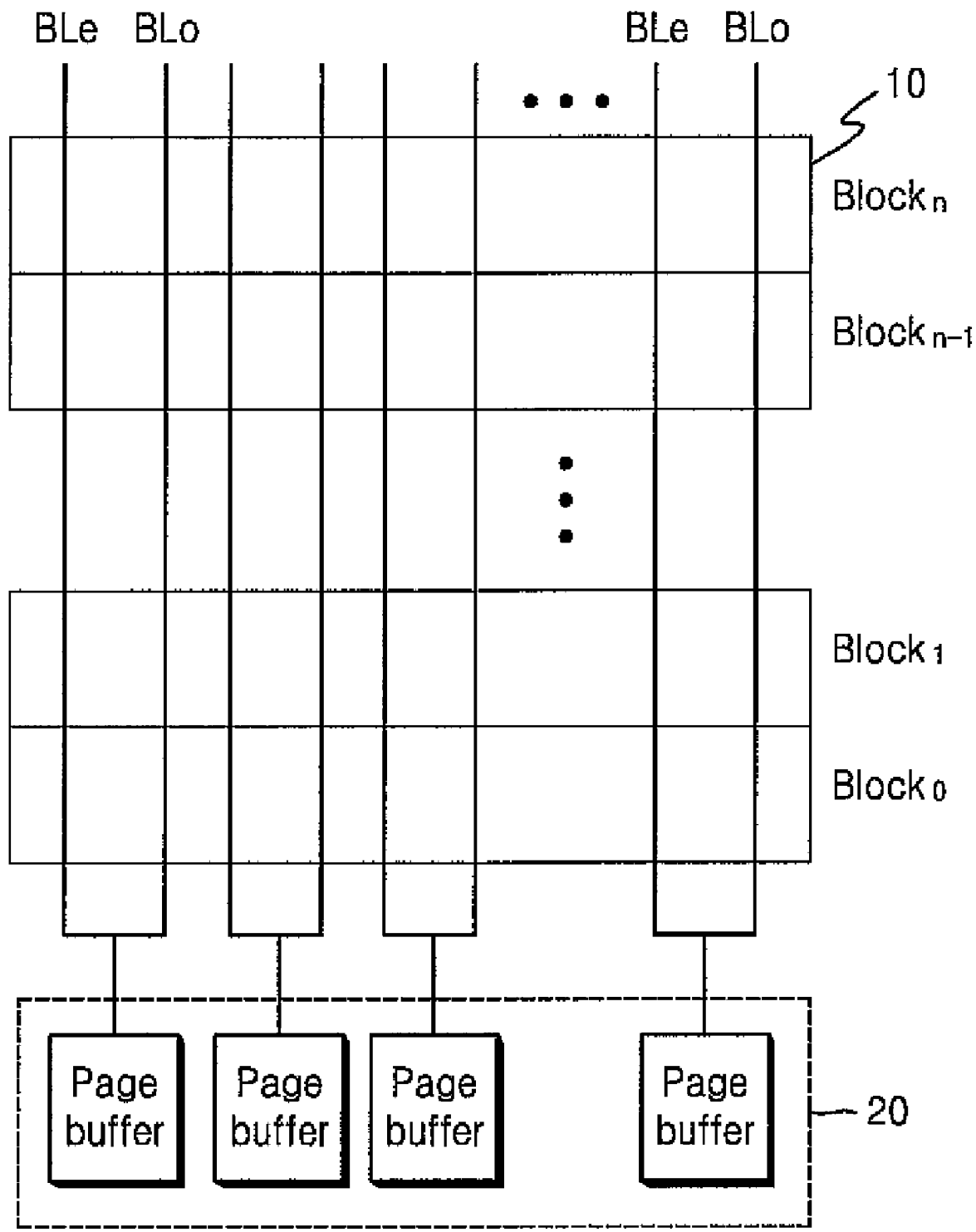
FIG. 2 is a block diagram of a memory cell array with bit lines and a page buffer unit.
Figure 3:
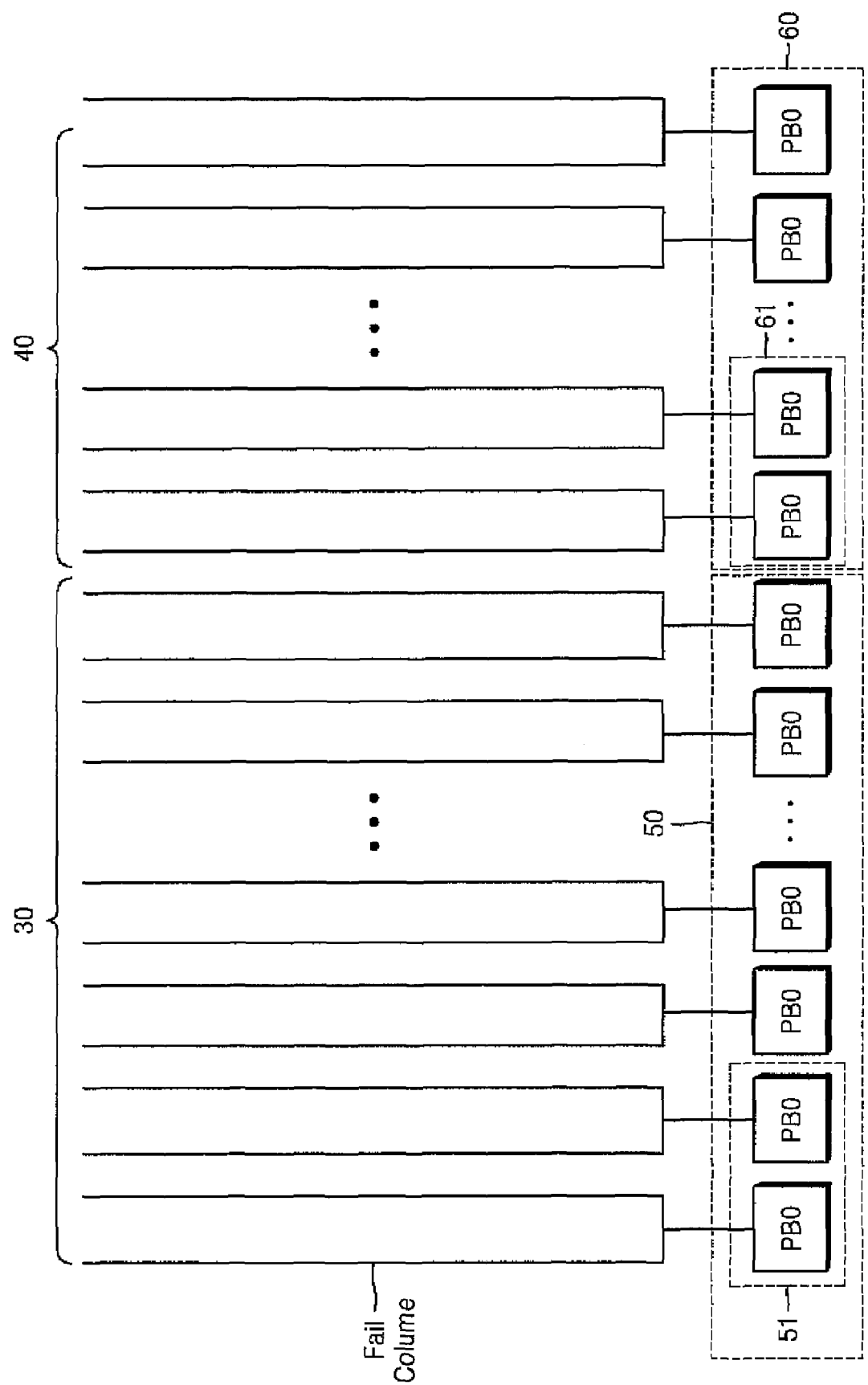
FIG. 3 is a block diagram of a memory cell array with a redundant cell array, and page buffer units.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals denote like or similar elements.

Various embodiments of the present invention provide a non-volatile memory device and method according to which errors can be prevented from occurring as a result of reading initial setting data related to setting of an operating environment, due to a defective column.

Figure 4:
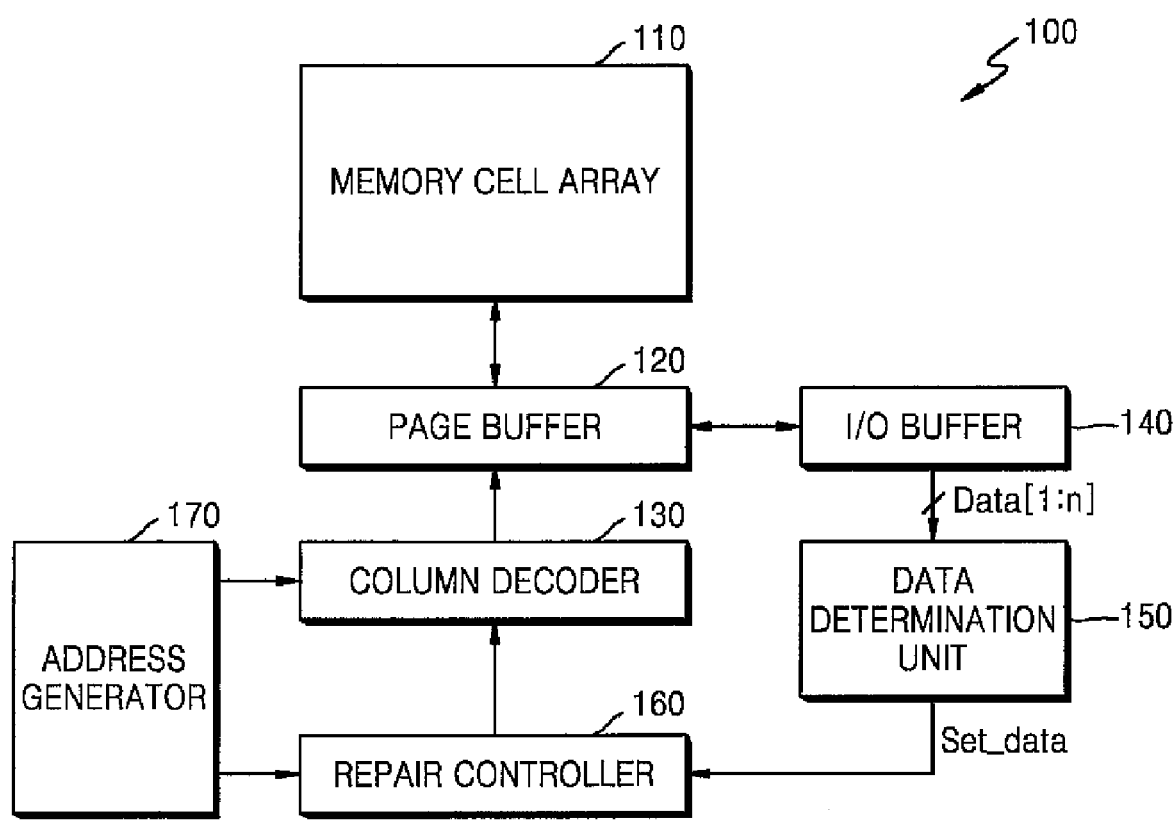
FIG. 4 is a block diagram of a non-volatile memory device, according to an embodiment of the present invention.

FIG. 4 is a block diagram of an exemplary non-volatile memory device 100 according to an embodiment of the present invention. Referring to FIG. 4, the non-volatile memory device 100 includes a memory cell array 110 in which one or more memory cells are arranged in a matrix; a page buffer 120 that operates as a sense amplifier during a read operation and stores data received from the memory cell array 110; and a column decoder 130 that receives and decodes column addresses and selects the bit lines of the memory cell array 110. Also, the non-volatile memory device 100 may include an input/output (I/O) buffer 140 that receives the data read from the page buffer 120, and controls output of the data.

The memory cell array 110 includes a cell array that stores data, and a redundant cell array that repairs defective bit lines. The cell array stores setting information related to setting an operating environment of the memory device 100. According to an embodiment of the present invention, the memory cell array 110 includes multiple regions. The setting information for a predetermined operation is copied, and the copied setting information is stored in multiple regions of the memory cell array 110. Initial setting data is determined based on the stored setting information, and the operating environment of the memory device 100 is set using the initial setting data.

When the memory device 100 is powered on, a data determination unit 150 of the non-volatile memory device 100 receives the setting information related to the setting of the operating environment from the I/O buffer 140. In particular, when setting information related to a predetermined operation is copied and stored in n regions of the memory cell array 110, the data determination unit 150 receives the stored n copies of the setting information Data[1:n] during an initial read operation of the memory cell array 110. Also, the data determination unit 150 determines initial setting data Set_data based on reading the n copies of setting information Data[1:n], and provides the initial setting data Set_data to an internal circuit of the memory device 100.

For example, when the initial setting data Set_data is address information for repairing a "fail" column, it is sent to a repair controller 160. When the "fail" column is accessed during a normal operation of the memory device 100, the repair controller 160 senses the access and replaces the "fail" column with a redundant column. An address generator 170 generates an address for accessing the memory cell array 110 and provides it to each of the elements of the memory device 100.

The operation of the non-volatile memory device 100 according to an illustrative embodiment of the present invention will now be described. When the memory device 100 is powered on, an initial read operation of the memory cell array 110 is performed to set the operating environment of the memory device 100. Then, one or more circuit blocks of the memory device 100 receive the initial setting data, and the operating environment of each of the circuit blocks is set based on the initial setting data. In the memory cell array 110, n copies of setting information related to setting a predetermined operation are respectively stored in n regions of the memory cell array 110. For example, the setting information may be information regarding a defective address for a repairing operation, or information for controlling a DC voltage related to programming, data reading or data erasing.

The setting information stored in the memory cell array 110 during the initial read operation is provided to the data determination unit 150 via the I/O buffer 140. When n copies of setting information Data[1:n] related to setting a predetermined operation are respectively stored in n regions of the memory cell array 110, the n copies of setting information Data[1:n] are sent to the data determination unit 150. The data determination unit 150 performs a "majority rule" determination operation with respect to the n copies of setting information Data[1:n], based on the detected values of the majority of the n copies. In other words, each stored copy of the setting information Data[1:n] includes multiple bits of data, and the data determination unit 150 compares the corresponding bits of each copy of the setting information Data[1:n] with one another to determine the (actual) value of each bit based on the stored value of that bit in the majority of the copies. For example, assuming that the normal data is "1," the read bit of the data is determined to be "1," even when one of the n copies of the data bit used for the comparison is a "0" due to a "fail" column, since the other n−1 copies of the data bit (i.e., the majority of the data bits) are "1."

Likewise, when setting information related to setting a predetermined operation consists of A bytes, each of the n copies of setting information Data[1:n] stored in the memory cell array 110 is A bytes long. The data bits of each of the n copies of setting information Data[1:n] are compared as described above in order to detect whether the majority of the n bits of the data is "1" or "0." Assuming that the normal value of a particular data bit is "0", for example, even when one or two copies of the bit of the n data bits is incorrectly read as "1" due to a "fail" column, it is possible to determine that "0" is valid data under the majority rule, since the remaining bits are "0." The above operation is performed in units of A bytes until the setting information is retrieved in its entirety.

Accordingly, a data bit having a value of "1" or "0" is determined to be valid among the n copies of each bit of data, and a plurality of data corresponding to the A bytes can be obtained. Also, a combination of the multiple copies, according to the result of the decision, is determined as the initial setting data Set_data. Accordingly, each bit of the initial setting data Set_data is determined from a combination of the data bits stored in normal columns, excluding "fail" columns. Thus, it is possible to prevent an error from occurring in the data even when the initial setting data Set_data is read prior to performing the repairing operation of the memory device 100. The initial setting data Set_data is provided to a predetermined circuit block of the memory device 100. For example, if the initial setting data Set_data is information regarding a defective address, the initial setting data Set_data is provided to the repair controller 160.

As described above, the values of n bits corresponding to each bit of data are determined under a majority rule based comparison, but the present invention is not limited thereto. For example, the data determination unit 150 may compare the n bits with one another, and determine the memory device 100 to be a "fail" when the total number of bits of data having the same data values, e.g., due to a "fail" column, is less than a predetermined value.

For example, in order to compare the values of the stored n copies of each data bit with one another, a predetermined integer m may be used, where m is less than or equal to n. It is determined whether the comparison reveals that the total number of data bit copies having the same value is equal to or greater than m. When the total number of copies having the same value is equal to or greater than m, data having that value may be determined to be valid, and the data value (occurring more than m times) may be the initial setting data. That is, when the result of the comparison reveals that the total number of bits of data having a value of 1, for example, is equal to or greater than m, the value of 1 is determined as valid data for the corresponding initial setting data bit. When the result of the comparison reveals that the total number of bits of data having a value of 1 is less than m, the memory device 100 may be determined as "fail."

Figure 5:
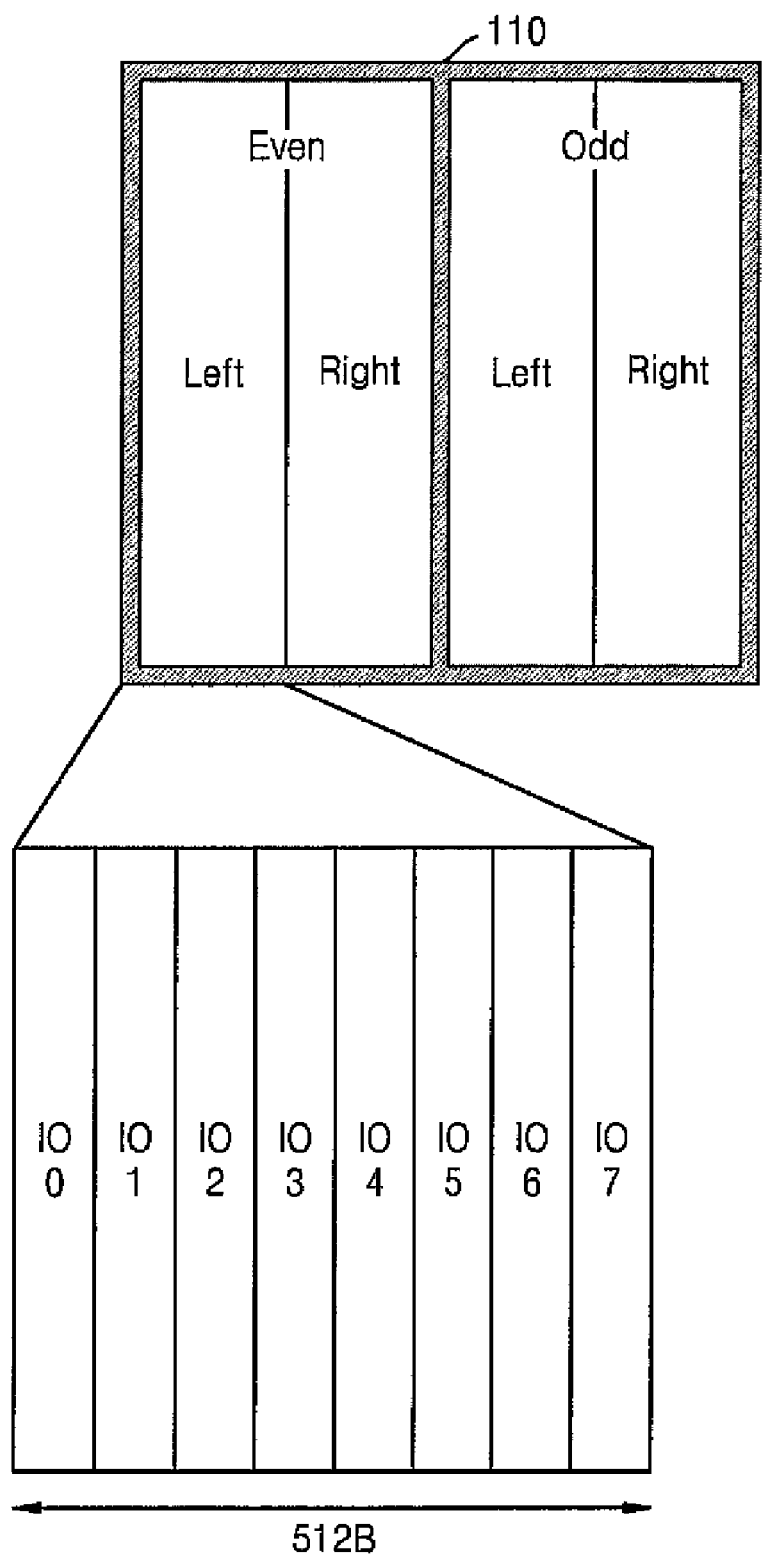
FIG. 5 is a diagram of a structure of a memory cell array included in the non-volatile memory device of FIG. 4, according to an embodiment of the present invention.

FIG. 5 illustrates an exemplary structure of the memory cell array 110 of the non-volatile memory device 100 of FIG. 4, according to an embodiment of the present invention. As illustrated in FIG. 5, in general, the memory cell array 110 may be divided into an even region and an odd region in order to perform interleaving. Each even region and odd region may be divided into a left region and a right region. If each page of the memory cell array 110 is 2 k bytes, the left and right regions are 512 bytes long. For example, the left region of the even region may consist of columns corresponding to eight input/output (I/O) units IO0 through IO7. The eight bits output from each of the I/O units IO0 through IO7 correspond to one byte of data.

Figure 6:
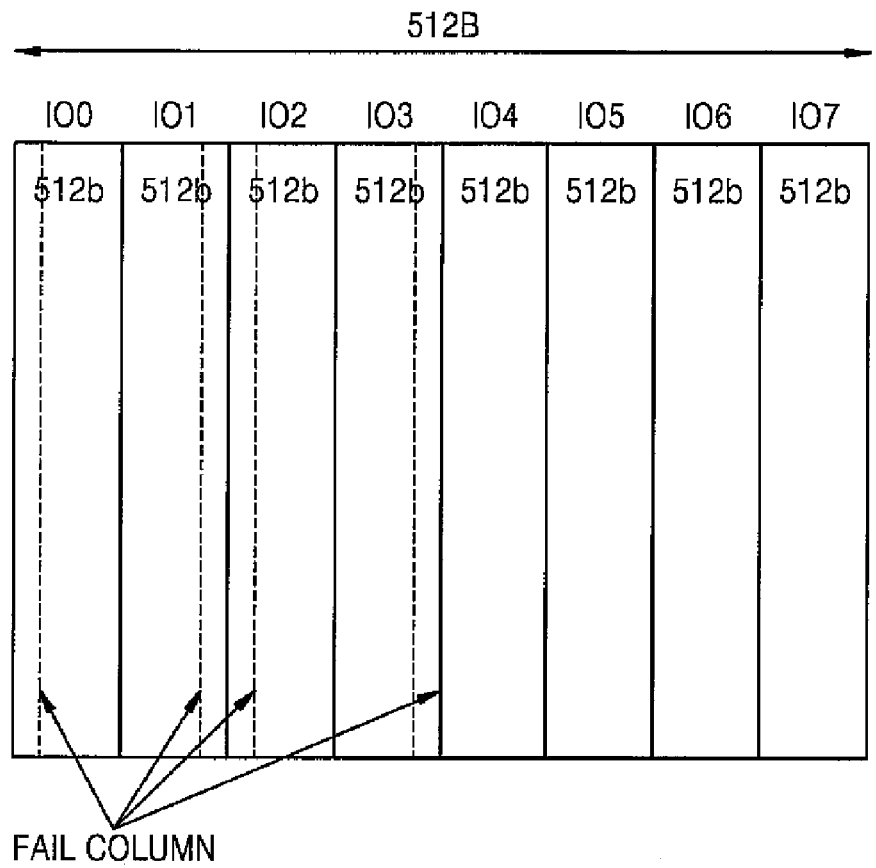
FIG. 6 is a diagram illustrating occurrence of a "fail" column.

FIG. 6 illustrates an exemplary occurrence of a "fail" column. The eight I/O units IO0 through IO7 of FIG. 6 correspond to a 512-byte column of the memory cell array 110. As illustrated in the example of FIG. 6, "fail" columns are randomly located in the I/O units IO0 through IO7.

Figure 7:
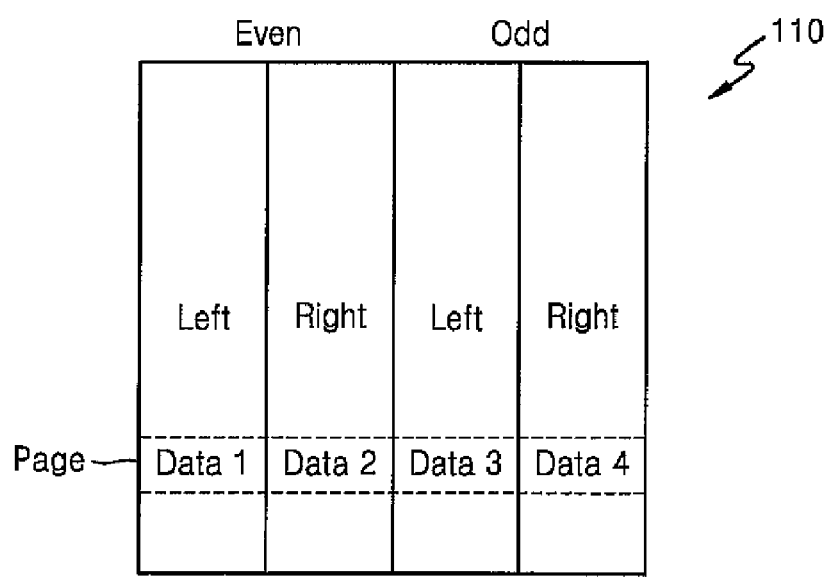
FIG. 7 is a diagram illustrating copying and storing setting information in a memory cell array, according to an embodiment of the present invention.

FIG. 7 illustrates copying and storing setting information in the memory cell array 110, according to an embodiment of the present invention. Referring to FIG. 7, the memory cell array 110 may be divided into an even region and an odd region, and each of the even and odd regions may be divided into a left region and a right region, as discussed above. When each page of the memory cell array 110 is 2 k bytes long, each of the left regions and the right regions consists of 512-byte columns.

In order to store setting information in the memory cell array 110, each page of the memory cell array 110 may include multiple regions, and setting information may be copied and stored in the regions. For example, referring to FIG. 7, the setting information may be copied and stored in the left regions and the right regions of one of the pages of the memory cell array 110. For example, first setting information Data 1 and second setting information Data 2 are stored in the left region and the right region of the even region, and third setting information Data 3 and fourth setting information Data 4 are stored in the left region and the right region of the odd region.

The first through fourth setting information Data 1 through Data 4 are set to be read at the same time when the memory device 100 is powered on and an initial read operation starts. Then, the values of the first through fourth setting information Data 1 through Data 4 are compared with one another, and initial setting data Set_data is determined based on the result of the comparison, as discussed above. For example, the values of the first bits from each of the first through fourth setting information Data 1 through Data 4 are compared with one another, and the value of the first bits which most frequently appears is determined to be the valid data value of the first bit under the majority rule.

Next, the values of the second bits of the first through fourth setting information Data 1 through Data 4 are compared with one another, and the valid data is determined for the second bit based on the result of the comparison. Valid data for the remaining bits of the first through fourth setting information Data1 through Data4 is also obtained as described above. A combination of valid data bits is determined as initial setting data Set_data.

Figure 8:
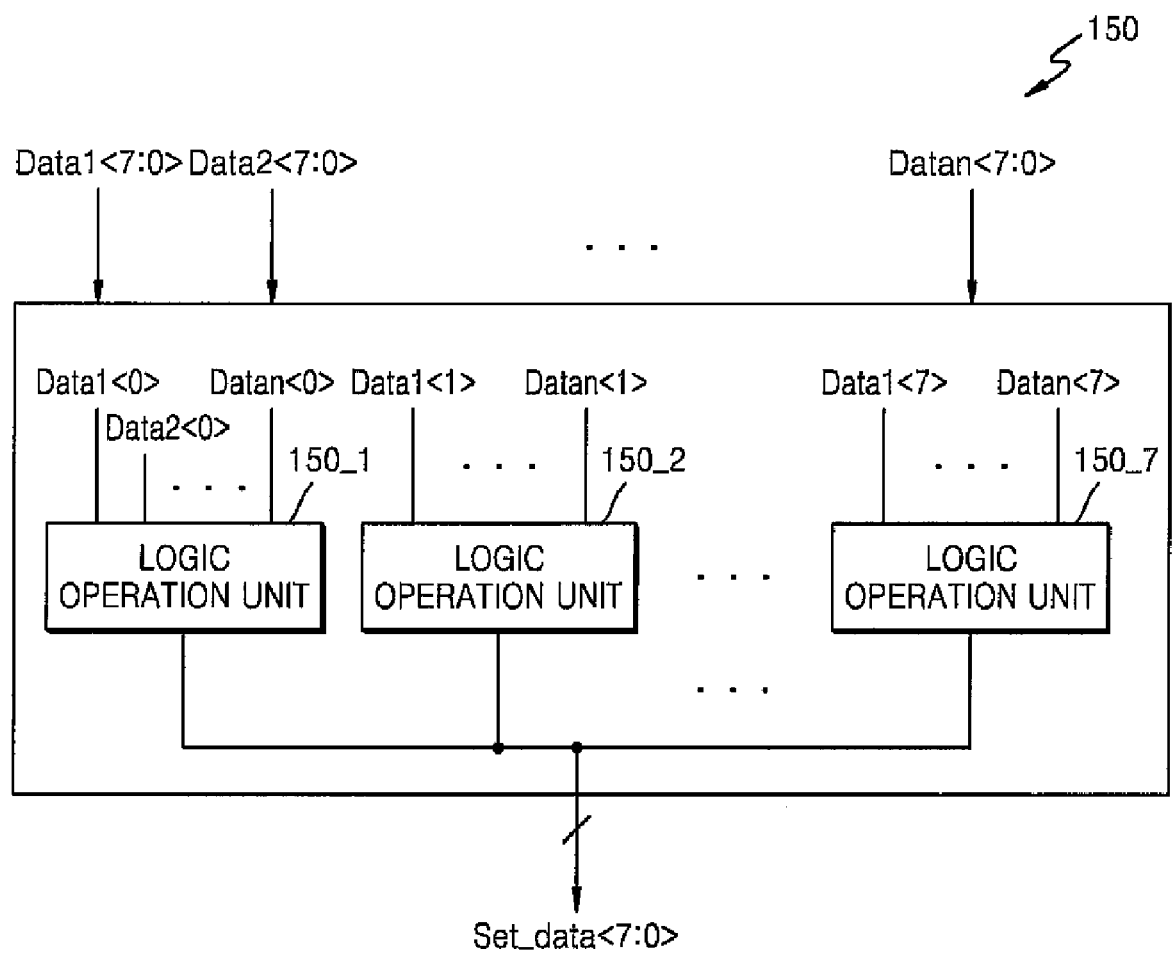
FIG. 8 is a block diagram of a data determination unit illustrated in FIG. 4, according to an embodiment of the present invention.

FIG. 8 is a block diagram illustrating an exemplary structure of the data determination unit 150 of FIG. 4, according to an embodiment of the present invention. Referring to FIG. 8, the data determination unit 150 may include multiple logic operation units 150_1 through 150_7 in order to receive multiple bits of data and to perform a logic operation thereon.

Setting information for setting a predetermined operation is copied as n copies of the setting information, and the n copies are stored in the memory cell array 110. The n copies of setting information are simultaneously read and sent to the data determination unit 150.

The first setting information Data1<7:0>, which is 1 byte long, is divided into data Data1<0> through Data1<7>, which are respectively sent to the logic operation units 150_1 through 150_7. Likewise, the second through $n^{th}$ pieces of setting information Data2<7:0> through Datan<7:0> are also divided into data Data2<0> through Data2<7>, Data3<0> through Data3<7>, . . . . Datan<0> through Datan<7>, and respectively sent to the logic operation units 150_1 through 150_7.

Each of the logic operation units 150_1 through 150_7 compares the values of the received bits of data with one another under the majority rule, and outputs data that is determined to be valid based on the result of the comparison. A combination of the data being respectively output from the logic operation unit 150_1 through 150_7 is determined as initial setting data Set_data<7:0>, which is 1 byte long.

Figures 9A, 9B:
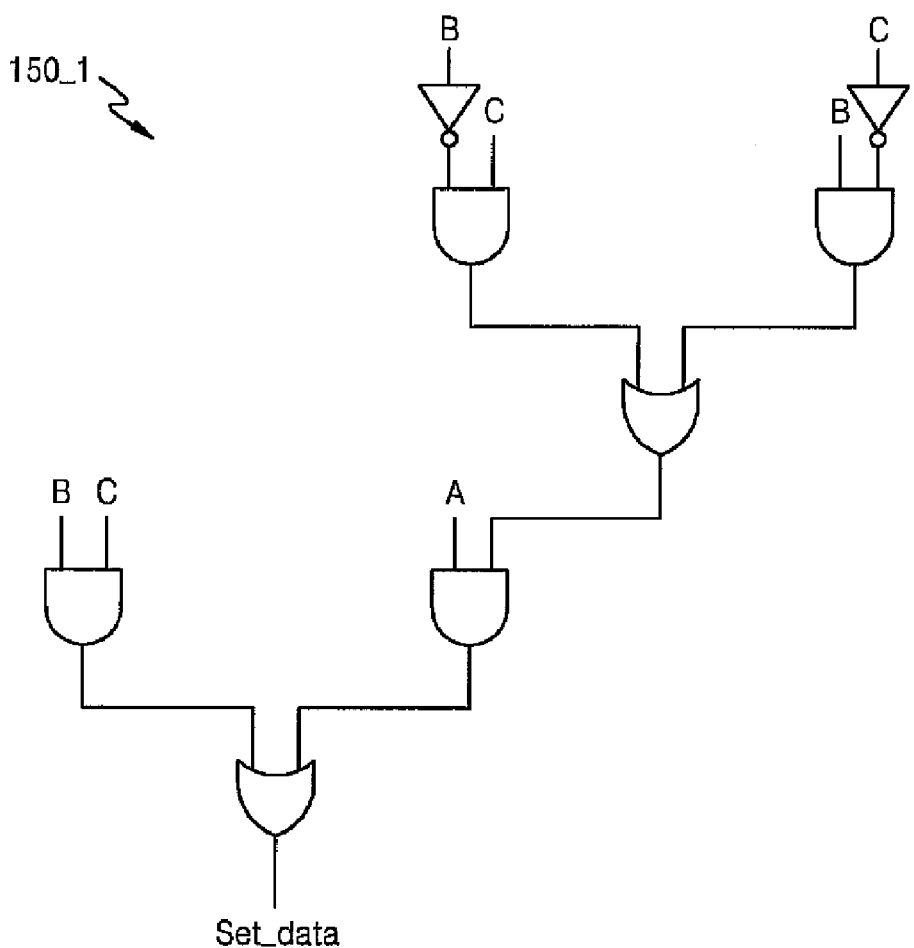
FIG. 9A is a table illustrating an exemplary determination of whether data is valid, according to an embodiment of the present invention.
FIG. 9B is a circuit diagram of a representative logic operation unit, as illustrated in FIG. 8, according to an embodiment of the present invention.

FIG. 9A is a table illustrating an exemplary determination of whether data is valid, according to an embodiment of the present invention. FIG. 9B is a circuit diagram of a logic operation unit, such as those shown in FIG. 8, according to an embodiment of the present invention.

In detail, FIG. 9A illustrates an operation of deciding whether information for setting a predetermined operating environment is valid. The information is copied and stored in the memory cell array 110 as three sets. For purposes of discussion, the bits of the first through third copied data sets of setting information Data1 through Data3 are A, B and C, respectively, and that the bits of initial setting data Set_data that are determined to be valid under majority rule is D.

The logic operation units 150_1 through 150_7 illustrated in FIG. 8 perform a logic operation to obtain the result illustrated in FIG. 9A, for example. In other words, each of the logic operation units 150_1 through 150_7 compares the values of corresponding data bits under majority rule. When the majority of the data bits is "0", "0" is determined to be valid data. When the majority of the data bits is "1", "1" is determined to be valid data.

The logic operation unit illustrated in FIG. 9B is an exemplary embodiment of the logic operation unit 150_1, although it is understood that it applies to logic operation units 150_1 through 150_7. More particularly, the logic operation units compare the values of copied data bits under majority rule.

With respect to the alternative embodiment discussed above, construction of a logic circuit that determines whether the total number of data bits having the same data value, from among n data bits corresponding to n copies of the setting information, is equal to or greater than m (m being a predetermined integer less than or equal to n) would be apparent to those skilled in the art. Therefore, a detailed description of this embodiment is not included.

In order to achieve the result based on majority rule, as illustrated in FIG. 9A, the logic operation unit (e.g., 150_1) receives data bits A, B and C, and may calculate the corresponding data bit D of the initial setting data Set_data according to the following formula: $D=BC+A(\overline{B}C+B\overline{C})$. To perform this calculation, each logic operation unit may include at least one inverter, AND-gate and OR-gate, as shown in FIG. 9B.

Figure 10:
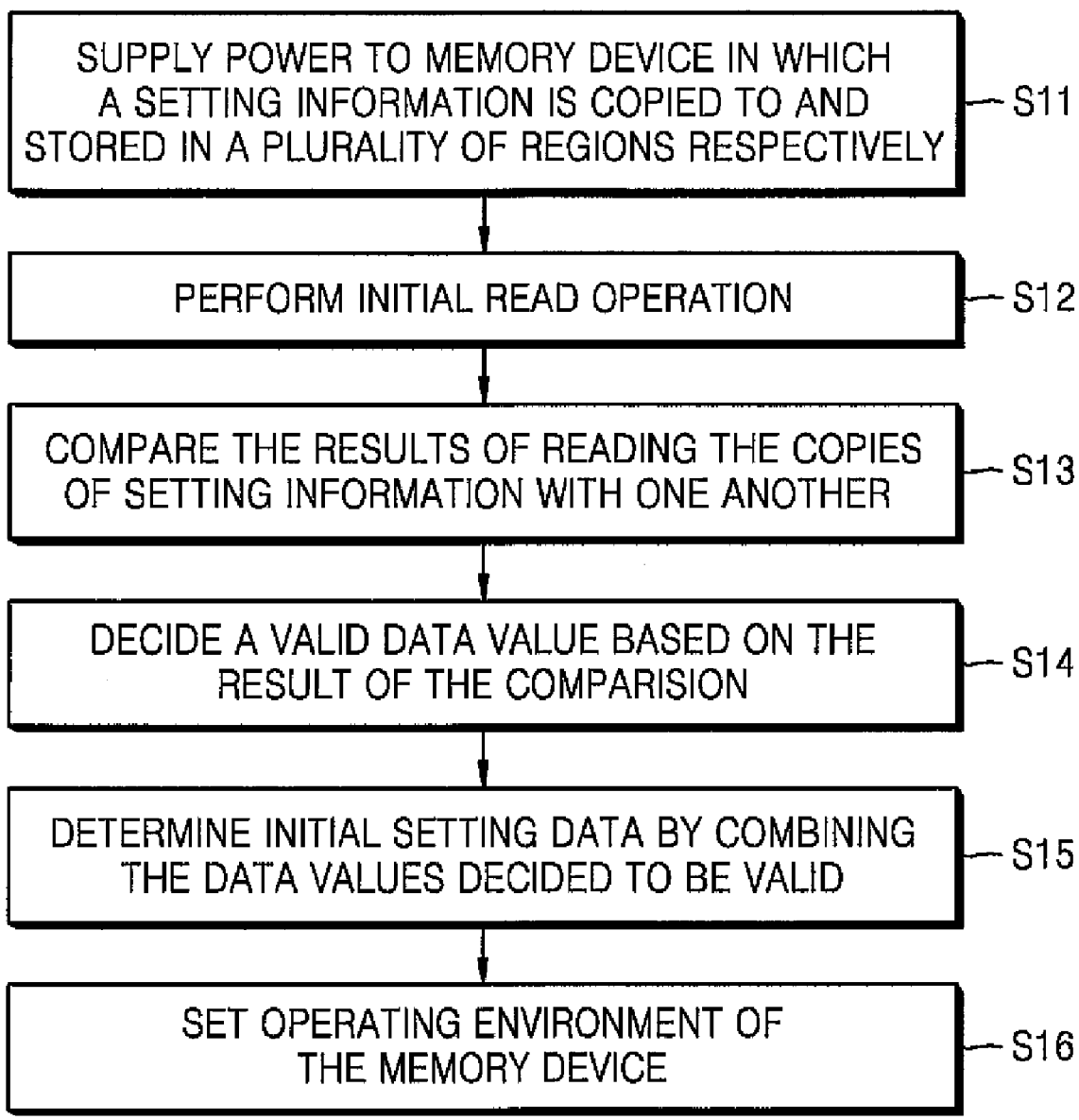
FIG. 10 is a flowchart illustrating an exemplary method of driving a non-volatile memory device, according to an embodiment of the present invention.

FIG. 10 is a flowchart illustrating an exemplary method of operating a non-volatile memory device, according to an embodiment of the present invention. Referring to FIG. 10, a non-volatile memory device is activated (e.g., powered on) (operation S11). Each page of a memory cell array of the non-volatile memory device may include multiple regions. Setting information related to setting a predetermined operating environment, for example, is copied and stored in the multiple regions of the memory cell array. The setting information may include address information for repairing, information for controlling a DC voltage, or other information.

In order to set the operating environment of the non-volatile memory device, an initial read operation of the memory cell array is performed (operation S12). The stored copies of setting information may be read from the memory cell array at the same time. Then, the copies of setting information are input to a predetermined logic circuit, and data values of the copies are compared with one another under the majority rule (operation S13).

The data values may be compared with one another in units of bits. For example, when the setting information is copied and stored in the memory cell array, the values of the first bits of the n copies of setting information are compared with one another. More particularly, the total number of first bits having a value of "1" is compared with that of first bits having a value of "0," and the data value occurring most frequently is determined to be the valid data value for the first bit (operation S14).

Next, the initial setting data is determined by combining the data values determined to be valid based on the comparison result (operation S15). The initial setting data is sent to an internal circuit of the memory device, which sets the operating environment based on the initial setting data (operation S16). Accordingly, even when a defect occurs in a bit line of the memory cell array, it is possible to provide valid initial setting data to the internal circuit of the memory device.

As described above, a non-volatile memory device and a method of driving the same are capable of sending valid initial setting data to an internal circuit regardless of a randomly occurring "fail" column, thereby preventing errors in setting an operating environment.

While the present invention has been shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a non-volatile memory device, the method comprising:
   supplying power to the memory device, in which setting information related to setting an operating environment is copied and stored in a plurality of regions of a memory cell array;
   performing an initial read operation of the memory cell array;
   determining initial setting data based on the initial read operation; and
   setting the operating environment of the memory device based on the initial setting data.

2. The method of claim 1, wherein the memory cell array comprises a plurality of pages, the plurality of pages comprising the plurality of regions in which the setting information is copied and stored.

3. The method of claim 1, wherein corresponding portions of the stored copies of the setting information are read at the same time.

4. The method of claim 1, wherein determining the initial setting data comprises:
   comparing corresponding portions of the stored copies of the setting information; and
   determining the initial setting data by combining the compared portions of the setting information to exclude a fail column.

5. The method of claim 1, wherein determining the initial setting data comprises:
   comparing first setting information through $n^{th}$ setting information with one another, where the first setting information through the $n^{th}$ setting information are respectively stored in n regions, and n is an integer equal to or greater than 2; and
   determining a data value occurring most frequently from among n data to be valid based on the comparison,
   wherein the n data comprises respective data of the n setting information.

6. The method of claim 5, wherein determining the initial setting data comprises:
   combining data values determined to be valid.

7. The method of claim 6, wherein each of the first through $n^{th}$ setting information is A bytes long, where A is an integer equal to or greater than 1, and
   data bits of each of the first through $n^{th}$ setting information are compared with one another to determine a most frequently occurring bit value, and a combination of the data bits determined to have valid bit values is determined as the initial setting data that is A bytes long.

8. The method of claim 1, wherein determining the initial setting data comprises:

reading and comparing first through $n^{th}$ copies of a portion of the setting information that are respectively stored in n regions, where n is an integer equal to or greater than 2;

if the result of the comparison reveals that a total number of the copies of the portion of the setting information having the same data value is equal to or greater than m, where m is a predetermined integer less than or equal to n, determining that the data value is valid for the corresponding portion of the setting information; and determining a combination of data values from additional portions of the setting information determined to be valid to be the initial setting data.

9. The method of claim 8, wherein each of the n copies of the setting information is A bytes long, where A is an integer equal to or greater than 1, and the reading and comparing of the first through $n^{th}$ copies of the portion of the setting information comprises comparing the values of bits of each of the first through $n^{th}$ copies of the portion of the setting information with one another.

10. A non-volatile memory device comprising:

a memory cell array comprising a plurality of regions, setting information related to setting an operating environment being copied and stored in the plurality of regions;

an input/output buffer for temporarily storing or outputting data received from the memory cell array; and a data determination unit for receiving copies of the setting information stored in the plurality of regions during an initial read operation performed when the memory device is powered on, comparing the copies of setting information with one another, and outputting initial setting data based on the comparison.

11. The non-volatile memory device of claim 10, wherein the memory cell comprises a plurality of pages, which comprise the plurality of regions.

12. The non-volatile memory device of claim 10, wherein during the initial read operation of the memory device, corresponding portions of the copies of the setting information are read at the same time.

13. The non-volatile memory device of claim 10, wherein the data determination unit determines the initial setting data by combining data stored in normal columns, excluding fail columns, based on the result of comparing the copies of setting information.

14. The non-volatile memory device of claim 10, wherein the data determination unit receives and compares first through $n^{th}$ copies of each portion of the setting information stored in n regions of the memory cell array, and determines a data value corresponding to each portion of the setting information occurring most frequently among the first through $n^{th}$ copies, based on the comparison, where n is an integer equal to or greater than 2.

15. The non-volatile memory device of claim 14, wherein the data determination unit determines the initial setting data by combining the determined data values.

16. The non-volatile memory device of claim 15, wherein each of the n copies of the setting information is A bytes long, where A is an integer equal to or greater than 1, and wherein the data determination unit comprises a plurality of logic operation units, each receiving corresponding data bits of each of the first through $n^{th}$ copies of the A bytes of setting information, where each of the logic operation units compares the received corresponding n data bits and determines a valid bit value based on a most frequently occurring value of the corresponding n data bits.

17. The non-volatile memory device of claim 16, wherein the data determination unit determines the initial setting data, which is A bytes long, by combining valid bit values and outputs the initial setting data.

18. The non-volatile memory device of claim 10, wherein the data determination unit compares first through $n^{th}$ copies of each portion of setting information, which are respectively copied and stored in n regions of the memory cell array, with one another, and when the comparison reveals that a total number of data having the same value for each portion of the setting information is equal to or greater than m, the data determination unit determines that the value is a valid data value for the corresponding portion of the setting information, where n is an integer equal to or greater than 2 and m is a predetermined integer less than or equal to n.

19. The non-volatile memory device of claim 18, wherein the data determination unit determines the initial setting data by combining a plurality of valid data values of corresponding portions of the setting information based on the result of the comparison.

20. The non-volatile memory device of claim 18, wherein each of the first through $n^{th}$ copies of each portion of the setting information is A bytes long, where A is an integer equal to or greater than 1, and the data determination unit compares bits of each of the first through $n^{th}$ copies of each portion of the setting information with one another.

* * * * *